United States Patent
Toh et al.

(10) Patent No.: US 7,068,117 B2
(45) Date of Patent: Jun. 27, 2006

(54) POWER SUPPLY RIPPLE REJECTION IN TUNER OSCILLATOR STAGE

(75) Inventors: Yeow Teng Toh, Singapore (SG); Hendricus Martinus Van Der Wijst, Krefeld (DE); Kam Choon Kwong, Singapore (SG)

(73) Assignee: Koninklijke Philips Electronics N.V., Eindhoven (NL)

( * ) Notice: Subject to any disclaimer, the term of this patent is extended or adjusted under 35 U.S.C. 154(b) by 7 days.

(21) Appl. No.: 10/478,736

(22) PCT Filed: May 27, 2002

(86) PCT No.: PCT/IB02/01870

§ 371 (c)(1),
(2), (4) Date: May 27, 2004

(87) PCT Pub. No.: WO02/097966

PCT Pub. Date: Dec. 5, 2002

(65) Prior Publication Data

US 2004/0201429 A1    Oct. 14, 2004

(30) Foreign Application Priority Data

May 28, 2001  (EP) ................................. 01201981

(51) Int. Cl.
*H03B 1/00*     (2006.01)
*H03L 1/00*     (2006.01)

(52) U.S. Cl. ........................... 331/175; 331/185
(58) Field of Classification Search ................ 331/185, 331/186, 175
See application file for complete search history.

(56) References Cited

U.S. PATENT DOCUMENTS

| | | | | |
|---|---|---|---|---|
| 3,670,264 A | * | 6/1972 | Wakai | 331/113 R |
| 4,032,973 A | * | 6/1977 | Haynes | 348/682 |
| 4,608,544 A | * | 8/1986 | Nordholt et al. | 331/109 |
| 4,751,475 A | * | 6/1988 | Kubo et al. | 331/117 D |

FOREIGN PATENT DOCUMENTS

FR    2602927 A1 *    2/1988

* cited by examiner

*Primary Examiner*—David Mis

(57) ABSTRACT

A bipolar transistor (Tr) in an oscillator stage of a tuner is provided with a diode (D10) in series with a resistor (R11) coupled between the base of the transistor (Tr) and the reference voltage to which the emitter of the transistor (Tr) is coupled. The diode (D10) allows a decreased resistor (R11) value which causes the supply voltage ripple (Vr1) on the collector originating from the base to decrease so as to better compensate the supply ripple (Vr2) on the collector directly originating from the supply voltage (Vs.).

3 Claims, 2 Drawing Sheets

POWER SUPPLY RIPPLE REJECTION IN TUNER OSCILLATOR STAGE

FIELD OF THE INVENTION

The invention relates to a tuner oscillator stage, a tuner comprising such a stage, and an electronic apparatus comprising such a tuner.

BACKGROUND OF THE INVENTION

Power supply voltage ripple rejection may be performed with the well-known CRC low-pass filter. A resistor is provided in series with one of the power supply voltage lines and a capacitor is connected between both power supply lines to which the load is connected. The capacitor smoothest the supply voltage supplied to the load. The filtering action of the CRC circuit improves by increasing the value of both the resister and the capacitor. However, the amount of filtering is limited because a too high value of the resistor causes a too large voltage drop across the resistor, which leads to a too high dissipation and to a too low voltage across the load. A large value of the capacitor gives rise to a too large and/or a too expensive capacitor.

SUMMARY OF THE INVENTION

It is an object of the invention to provide a tuner oscillator stage with an improved supply voltage ripple suppression.

To this end, a first aspect of the invention provides a tuner oscillator stage as defined in claim 1. A second aspect of the invention provides a tuner as defined in claim 4. A third aspect of the invention provides an electronic apparatus as defined in claim 5. Advantageous embodiments are defined in the dependent claims.

The tuner oscillator stage comprises a transistor which has a control electrode, and two electrodes of a main current path. A power supply voltage is present between a first and a second terminal. A first impedance is coupled between the control electrode and the first terminal. A series arrangement of an element having a low impedance for AC current and a well defined voltage drop for DC current and a second impedance is coupled between the control electrode and the second terminal. The element (which may be a circuit comprising several elements) allows a decreased value of the second impedance which causes the supply voltage ripple on the collector originating from the supply voltage ripple on the control terminal to decrease without disturbing the DC drive of the transistor. In this way, the supply ripple on the collector directly originating from the supply voltage is better compensated.

In a preferred embodiment, the element is a diode which is poled to be conductive.

These and other aspects of the invention are apparent from and will be elucidated with reference to the embodiments described hereinafter.

DETAILED DESCRIPTION OF A PREFERRED EMBODIMENT

Figure 1:
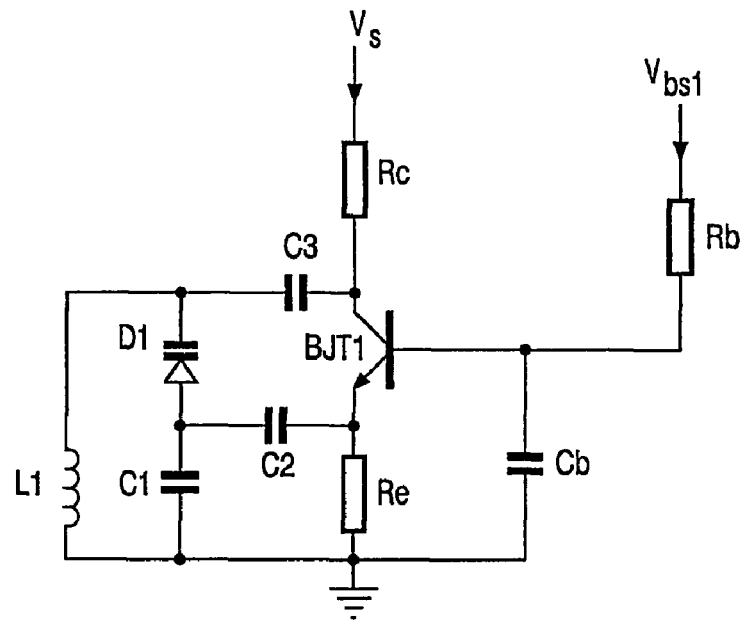
FIG. 1 shows a typical prior-art oscillator tank circuit.

FIG. 1 shows a typical prior-art oscillator tank circuit.

Ripple susceptibility in a TV receiver is defined as the peak-to-peak value of a sine-wave signal from 20 Hz to 500 kHz superposed on the power supply voltage, causing an amplitude modulation with a modulation depth of 0.28% on the picture carrier after passing the Nyquist slope of the IF filter of the receiver.

FIG. 1 shows a typical oscillator circuit with a bipolar transistor BJT1 and an emitter resistor Re, and a resonance circuit comprising a coil L1, a capacitor C1, and the capacitors C2 and C3 together with a varicap diode D1 whose capacitance value depends on the voltage across it. The supply voltage ripple is introduced via two paths. The ripple on the power supply voltage Vs. will be present on the collector of the transistor BJT1 via the collector resistor Rc. The ripple on the band-switch power supply voltage Vbs1 will be attenuated with the low-pass filter comprising the resistor Rb and the capacitor Cb. The ripple originating from the supply voltage Vbs1 can be easily suppressed by using a resistor Rb with a high value which does not lead to a too large voltage drop across this resistor Rb because the current into the base of the transistor BJT is very small. The ripple on the power supply voltage Vs. will be present on the collector directly and thus has to be filtered sufficiently, which give rise to a large and/or expensive capacitor (not shown) because a large value of the resister Rc is not possible due the relatively large current through it. In tuners, a large capacitor causes a problem because the space is not available, so that a very expensive tantalum capacitor is required.

Figure 2:
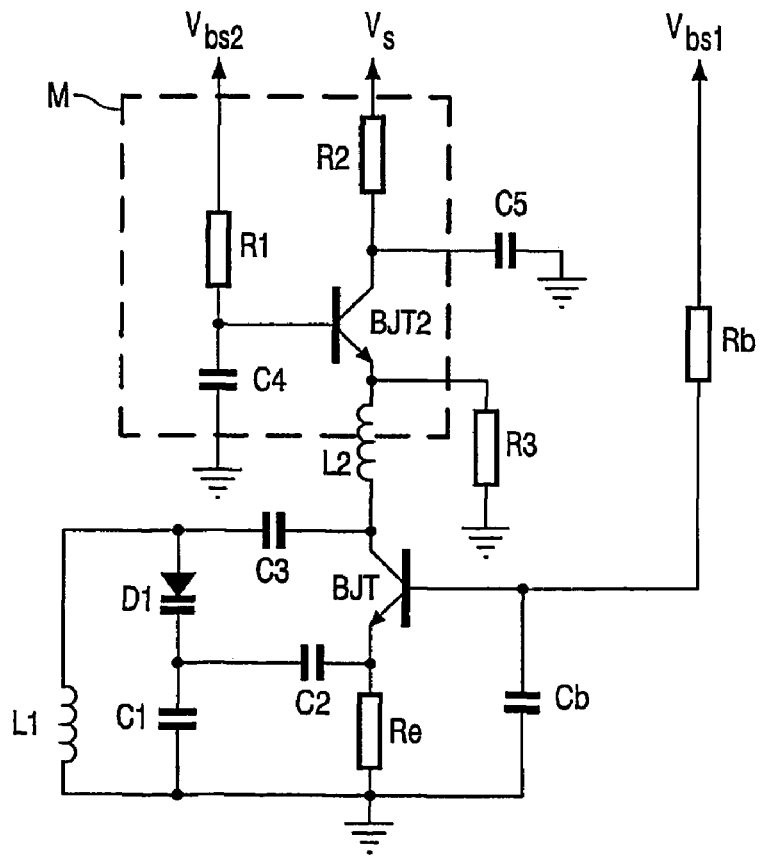
FIG. 2 shows a typical prior-art series mixer and oscillator design.

FIG. 2 shows a typical prior-art series mixer and oscillator design. The oscillator circuit in FIG. 2 is almost identical to that shown in FIG. 1, and the same elements are denoted by the same references. The only difference is that the collector resistor Rc has been replaced by an impedance L2. The mixer comprises a transistor BJT2 with a base connected to a band-switch power supply voltage Vbs2 via the resistor R1. A filter capacitor C4 together with the resistor R1 filters the band-switch voltage Vbs2 to suppress the power supply ripple on the base of the transistor BJT2. The collector of the transistor BJT2 is connected to the power supply voltage Vs. via the resistor R2. A capacitor C5 together with the resistor R2 filters the power supply voltage Vs. to suppress the power supply ripple on the collector of the transistor BJT2. The resistor R3 improves the DC behavior of the mixer stage M.

The mixer stage M has the functions of both mixer and ripple rejecter.

Figure 3:
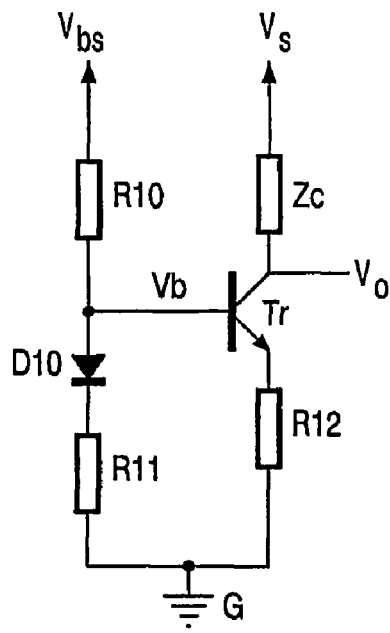
FIG. 3 shows a simplified oscillator circuit according to an embodiment of the invention.

FIG. 3 shows a simplified oscillator circuit according to an embodiment of the invention.

In the oscillator circuit of FIG. 1 and the oscillator and mixer circuit of FIG. 2, the suppression of the power supply voltage Vs. requires a large and/or expensive capacitor. This problem becomes more severe in modern tuners which have a low power supply voltage Vs. (for example, 5 volts). The low power supply voltage Vs. requires the voltage drop across the filter resistor to be very small, requiring an excessively large or expensive smoothing capacitor. The series arrangement of the mixer and the oscillator shown in FIG. 2 has the further drawback that, due to the voltage drop across the mixer transistor BJT2, the voltage available for the oscillator decreases. This also becomes a severe problem at low power supply voltages Vs.

The invention is based on the recognition that the influence on the total ripple on the collector is a sum of the ripple caused via the base and the ripple on the collector caused by the supply voltage coupled to the collector, wherein these two ripple contributions have opposite signs, and thus may compensate each other. The prior-art approach of suppressing both the ripple on the base and on the collector as much as possible will not give rise to an optimal compensation.

The transistor TR has a base connected to a power supply voltage Vbs (which may be a band-switch voltage) via a resistor R10. A series arrangement of a diode D10 and a resister R11 is connected between base and ground G. The collector of the transistor TR is connected to the power supply voltage Vs. via the impedance Zc, and the emitter of the transistor is connected to earth via resistor R12. The voltage on the collector which is Vo comprises a DC part Vodc and a ripple component Vor.

If the ripple on the power supply voltage Vbs is Vr1, and the ripple on the power supply voltage Vs. is Vr2, the ripple voltage Vor on the collector is:

$$Vor = Vr2 - \frac{Z_C}{R_{12}} \cdot \frac{R_{11}}{R_{10}+R_{11}} \cdot Vr1$$

Figure 4A:
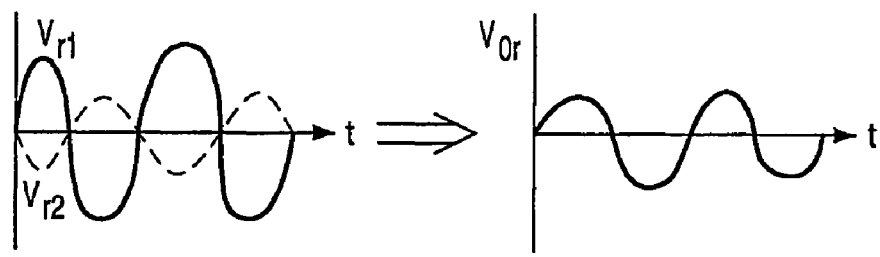
FIG. 4 shows waveforms of signals occurring in the simplified oscillator circuits of FIG. 2 and FIG. 3.

Without the diode D10, and due to the required DC operation of the oscillator, the resistor R11 usually has a value (for example, 2.7 kohm) which causes the ripple originating from the base to be much larger than the ripple originating from the power supply voltage Vs., see FIG. 4A.

With the diode D10, the value of the resistor R11 can be decreased while maintaining substantially the same DC operation. Now the ripple contribution to the collector ripple voltage Vor originating from the base decreases and a better compensation is achieved, see FIG. 4B.

Figure 4B:
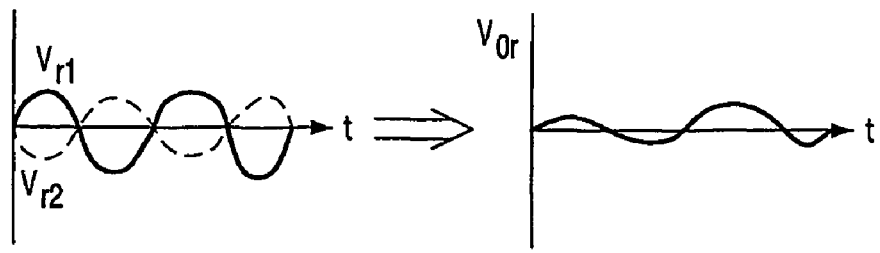

FIG. 4 shows waveforms of signals occurring in the simplified oscillator circuits of FIG. 2 and FIG. 3. FIGS. 4A and 4B show, in the left diagram, the waveforms representing the ripple voltages Vr1 (in bold) and Vr2 (dashed) and, in the right diagram, the resultant ripple voltage Vor, respectively, without and with the diode D10.

It should be noted that the above-mentioned embodiments illustrate rather than limit the invention, and that those skilled in the art will be able to design many alternative embodiments without departing from the scope of the appended claims. For example, it is also possible to use a pnp transistor instead of the npn transistor shown. It is possible to have the collector coupled to earth potential and the emitter to a negative potential.

In the claims, any reference signs placed between parenthesis shall not be construed as limiting the claim. The verb "comprising" and its conjugations does not exclude the presence of elements or steps other than those stated in a claim. The invention can be implemented by means of hardware comprising several distinct elements, and by means of a suitably programmed computer. In the device claim enumerating several means, several of these means can be embodied by one and the same item of hardware.

The invention claimed is:

1. A method of suppressing supply voltage ripple in an output of a tuner oscillator stage, the tuner oscillator stage comprising:
    a transistor having a control electrode, and two electrodes of a main current path,
    a first impedance being coupled between the control electrode and a first terminal,
    a second impedance being coupled between the control electrode and a second terminal,
    a third impedance being coupled between one of the two electrodes of the main current path and the second terminal, and
    an element being arranged in series with the second impedance, the element having a low impedance for AC current and a well-defined voltage drop for DC current, the first and the second terminal being arranged to receive a power supply voltage, the method comprising the steps of:
    allowing a first ripple occurring in a power supply voltage at the first terminal to be applied to said control electrode of said transistor, whereby said transistor passes said first ripple; and
    combining, at an output of said tuner oscillaton stage, said first ripple with a second ripple occurring in a power supply voltage supplied to said main current path, whereby said first ripple and said second ripple have opposite signs and compensate for each other.

2. The method as claimed in claim 1, wherein the transistor is a bipolar transistor having a base, a collector and an emitter, the first impedance being coupled between the base and the first terminal, the second impedance being coupled between the base and the second terminal, a collector impedance being coupled between the collector and a third terminal, the third impedance being coupled between the emitter and the second terminal, and the element being arranged in series with the second impedance.

3. A method as claimed in claim 1, wherein the element comprises a diode, which is poled to conduct in operation.

* * * * *